(12) United States Patent
Kleyman et al.

(10) Patent No.: US 6,473,673 B1
(45) Date of Patent: Oct. 29, 2002

(54) METHOD AND SYSTEM FOR MANAGEMENT OF HETEROGENEOUS ASSEMBLIES

(75) Inventors: Vadim Kleyman, Andover, MA (US); Asa Gray Trainer, Framingham, MA (US); Milos Zupanski, Framingham, MA (US)

(73) Assignee: Parametric Technology Corporation, Needham, MA (US)

( * ) Notice: Subject to any disclaimer, the term of this patent is extended or adjusted under 35 U.S.C. 154(b) by 0 days.

(21) Appl. No.: 09/316,547

(22) Filed: May 24, 1999

(51) Int. Cl.[7] .............................................. G06F 19/00
(52) U.S. Cl. ...................................... 700/182; 345/672
(58) Field of Search ................................. 345/672, 964; 700/182; 706/919; 707/502

(56) References Cited

U.S. PATENT DOCUMENTS

| | | | |
|---|---|---|---|
| 4,813,013 A | 3/1989 | Dunn | 364/900 |
| 5,070,534 A | 12/1991 | Lascelles et al. | 395/155 |
| 5,262,761 A | 11/1993 | Scandura et al. | 340/133 |
| 5,272,642 A | 12/1993 | Suzuki | 364/474.24 |
| 5,412,776 A | 5/1995 | Bloomfield et al. | 395/160 |
| 5,701,137 A | 12/1997 | Kiernan et al. | 345/119 |
| 5,850,535 A | 12/1998 | Maystrovsky et al. | 395/500 |

FOREIGN PATENT DOCUMENTS

| | | | |
|---|---|---|---|
| EP | 0241071 | 10/1987 | G06F/15/72 |
| EP | 0397904 | 11/1990 | G06F/15/72 |
| JP | 10-240793 | 9/1998 | G06F/17/50 |
| WO | WO 9722952 | 6/1997 | G06T/17/10 |

OTHER PUBLICATIONS www.datranet.com/page 13.htm "Direct and Step Cad System Database Translators" Datranet.

Glicksman, J. "Identifying Objects in Interactive Workstation Environments" *Proceedings of the 1st International Conference on Computer Workstations, San Jose, CA, 11–14 Nov. 1985*; pp. 144–150 (1985).

Primary Examiner—Jeffery Brier
Assistant Examiner—G. F. Cunningham
(74) Attorney, Agent, or Firm—Lahive & Cockfield, LLP

(57) ABSTRACT

In a data processing system having a plurality of CAD systems, an associative topology bus facilitates the management of heterogeneous assemblies of geometric objects. The constituent geometric objects can be geometric primitives or they can be assemblies, both homogeneous and heterogeneous. The associative topology bus enables a user of a CAD system operating on a heterogeneous assembly to recognize the existence of a change in a constituent component of that assembly and to do so in real time. The associative topology bus performs this task by augmenting the representation of the heterogeneous assembly with translated image models corresponding to each of the constituent CAD systems of the data processing system. Each translated image model is generated by operating on a master geometry representation of the heterogeneous assembly with a mapping table corresponding to each of the constituent CAD systems of the data processing system.

24 Claims, 5 Drawing Sheets

METHOD AND SYSTEM FOR MANAGEMENT OF HETEROGENEOUS ASSEMBLIES

This application relates to computer-aided-design systems, and in particular, to methods and systems for management of geometric objects in heterogeneous assemblies of such objects.

BACKGROUND

A computer-aided design (CAD) system is a tool for creating models of geometric objects on a computer system. These geometric objects, which are typically representative of physical structures, are built by a user using a series of commands that instruct the system to produce primitive entities such as solids, curves, or lines, to define their dimensions, to translate or rotate them through space, and to combine them in various ways. To create a model of a complex system, a user typically builds the simpler geometric objects representing components or sub-assemblies of the system and assembles those geometric objects to form more complex assemblies comprising several such geometric objects. When all the geometric objects comprising the assembly are generated by the same CAD system, such an assembly is referred to as a "homogeneous assembly." When the geometric objects comprising the assembly are generated by different CAD systems, the assembly is a "heterogeneous assembly."

A geometric object created by a CAD system is typically represented using a proprietary format that depends on the particular CAD system creating the object. Because the format for an object created by one CAD system is generally different from the format for an object created by another CAD system, it is often not possible for one CAD system to operate directly on an object created by another CAD system.

This inability of a CAD system to freely operate on objects created by other CAD systems is disadvantageous in an environment in which each of several users contributes a particular component or sub-assembly of a heterogeneous assembly. In such environments, which are increasingly common in the preparation of complex system models, different components are created with different CAD systems and integrated into a single heterogeneous assembly. For example, in the design of an artillery gun, one designer, using a first CAD system, may provide the barrel and breech, while another, using a second CAD system, may provide the wheels and axle, and yet another designer, using a third CAD system, may provide the shell. These three components, the wheel and axle, the barrel and breech and the shell, must then be integrated into a single heterogeneous assembly, either using one of the three CAD systems already used or using a fourth CAD system.

It is known in the art to translate a data structure representative of a geometric object in a source format into a corresponding data structure representative of the same geometric object in a target format. It is also known to represent geometric objects in a common format (for example, the IGES format) that is understood by a variety of CAD systems. Thus, the problem of assembling static collections of geometric objects into heterogeneous assemblies is largely solved.

A difficulty arises in assembling dynamic collections of geometric objects into heterogeneous assemblies. For example, it is sometimes necessary to later modify the geometric object created by a particular CAD system. Unless these alterations are communicated to all parties involved in the design of the structure, the other parts of the structure might not be modified in order to accommodate the change.

In the context of the foregoing example, the designer of the shell may, after extensive wind tunnel experiments, discover that a slight alteration in the shell's diameter and length will improve its accuracy. Assuming, incorrectly, that such a minor change could not possibly affect his colleagues' designs, he neglects to inform them. However, after production and field testing, it is discovered that, as a result of the slight change in the weight distribution, the gun is subject to a violent recoil when fired. As a result, the shell designer's simple failure to communicate requires extensive redesign and retooling to correct the problem.

In the case of a homogeneous assembly, in which all designers work on the same CAD system and all components in the assembly are derived from the same CAD system, it is known in the art to automatically update a component already included in the assembly when a modification is made to that component by the designer who created it. A CAD system having this property is said to display "associativity." Thus, in the context of the above example, if all three designers had been using the same associative CAD system, the shell designer's minor change to the shell would have been automatically incorporated into the finished structure and all parties would have been automatically notified of the change.

However, associativity has thus far not been extended to the case of a heterogeneous assembly. In the case of a heterogeneous assembly it is still incumbent on the designer who changes a component to communicate that change to others. Thus, although modern CAD systems have the ability to assemble geometric objects created in other CAD systems into a heterogeneous assembly, no procedure exists for automatically detecting the existence of a change in one of the geometric objects comprising the heterogeneous assembly and communicating the existence and nature of that change, in real-time, to other users operating on the assembly.

What is therefore desirable in the art is a method and system for enabling a CAD system to recognize that a constituent component of a heterogeneous assembly has been modified and to incorporate, at the discretion of the user of that CAD system, that modification into the heterogeneous assembly. Such a method and system would enable the heterogeneous assembly to at last be the functional equivalent of a homogeneous assembly.

A method by which a target CAD system detects a change in a constituent component, represented in a source format, of a heterogeneous assembly includes the steps of providing a master geometry representation of the heterogeneous assembly in a target format associated with the target CAD system. The method further includes the step of providing a change indicative means, for example a change flag, that indicates whether or not there have been any changes to the constituent component. The change indicative means is then monitored to detect any changes in the constituent component. Optionally, the method can include a further step of transmitting a message to the target CAD system upon a detection of a change in the constituent component.

To further improve performance, the method of the invention includes the steps of providing a mapping table for establishing a correspondence between the source format representation of the constituent component and a target format representation of that component. This is followed by the step of deriving, from the master geometry representation and the mapping table, a translated image model that represents the constituent component of the heterogeneous assembly, but in the target format.

SUMMARY

A data processing system embodying the invention includes a first and second CAD system with associated first and second formats. The first CAD system operates upon the heterogeneous assembly while the second CAD system operates upon and modifies a constituent component of the heterogeneous assembly. The first and second CAD system are connected to each other by an associative topology bus. In addition to facilitating the transfer of data representative of the heterogeneous assembly and its constituent components between the first and second CAD systems, the associative topology bus, the operation of which is described below, alters the representation of the heterogeneous assembly so as to facilitate the detection of changes to the constituent components of the assembly.

In the preferred embodiment, the associative topology bus accomplishes this task by generating a master geometry representation of the heterogeneous assembly in the first format and providing a change flag indicative of the existence of a change in the constituent component of the heterogeneous assembly. The associative topology bus then monitors the change flag so as to detect any changes to the constituent component. Optionally, the associative topology bus takes the further step of notifying the first CAD system of the change in the constituent component so as to provide the user of the first CAD system with the option of accepting or rejecting the change.

To further improve its performance, the associative topology bus provides a mapping table for establishing a correspondence between the representation of the constituent component in the first format and a representation of the constituent component in the second format. This mapping table is then used, in conjunction with the master geometry representation, to derive a translated image model representative of the constituent component in the first format.

In addition to linking the first and second CAD systems to each other, the associative topology bus can link the first and second CAD systems, together with additional CAD systems, with a geometry database in which the constituent components of the heterogeneous assemblies are stored. This additional feature of the invention enables the system to be readily expandable to accommodate any number of CAD systems, all of which can operate on different constituent components of the heterogeneous assembly independently of each other. In such a system, the associative topology bus ensures that although the individual CAD systems can work independently of each other on their respective constituent components, the heterogeneous assembly itself is constantly kept up-to-date without the active efforts of the users of the individual CAD systems.

These and other features, aspects, and advantages of the invention will be better understood with reference to the following description and the accompanying drawings in which:

DETAILED DESCRIPTION

In the preferred embodiment, a data processing system embodying the invention includes software for: augmenting the representation of a geometric object with information indicative of a change in the object; monitoring that information to determine whether a change has occurred; and notifying a CAD system that operates on a heterogeneous assembly referencing that geometric object that a change has occurred. The preferred embodiment also includes hardware for linking several CAD systems to a common geometry database in which is stored the augmented representation of the geometric object. This software and hardware, colectively referred to as the associative topology bus, provides a mechanism for permitting a CAD system to modify a geometric object that is a constituent component of a heterogeneous assembly operated upon by another CAD system and to automatically notify that other CAD system of any changes in the constituent geometric object.

Figure 1:
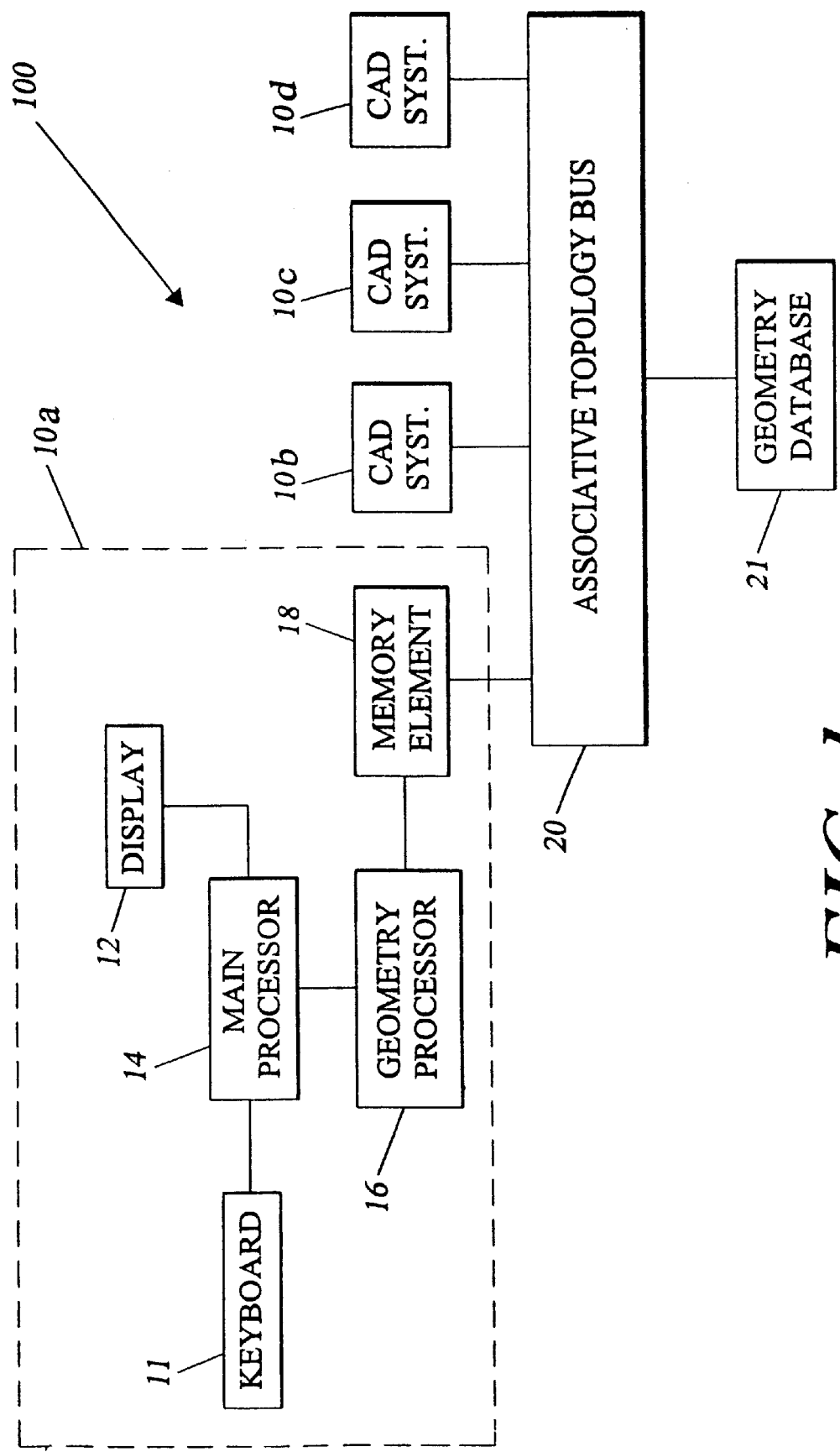
FIG. 1 shows a block diagram of a plurality of CAD systems in communication with an associative topology bus in a data processing system embodying the principles of the invention.

Referring to FIG. 1, a preferred data processing system 100 embodying the invention includes a first CAD system 10a linked to a geometry database 21 of geometric objects by means of an associative topology bus 20. The first CAD system can be a CAD system such as PROENGINEER 2000, available from Parametric Technology of Waltham, Mass.

The geometry database 21 can be a collection of files, either on a single server or distributed across several servers. Alternatively, the database can be an enterprise-wide data management system such as the WINDCHILL system available from Parametric Technology of Waltham, Mass. As shown in FIG. 1, the geometry database 21 is linked to a plurality of CAD systems, 10b–10d, all of which can store and retrieve geometric objects in the geometry database 21. Each of the plurality of CAD systems 10b–10d includes components similar to those described below in connection with the first CAD system 10a.

The associative topology bus 20 includes software for managing access to the geometric objects by the CAD systems 10a–10d making up the data processing system 100. The associative topology bus 20 achieves this by augmenting the representation of the geometric object in a manner that facilitates detection of change and that enables the object to be recognized and interpreted by a variety of CAD systems.

The first CAD system 10a includes one or more input devices 11, typically a keyboard operating in conjunction with a mouse or similar pointing device, for communicating instructions from a user to a main processor 14. The main processor 14 is coupled both to a graphics processor 16, which can be a separate hardware element or executable software loaded into memory, and to a display terminal 12.

The main processor 14 routes those instruction received from the user that are related to the creation and manipulation of geometric objects to the graphics processor 16 and receives instructions from the graphics processor 16 to display appropriate geometric structures on the display terminal 12. The resulting display on the display terminal 12 provides visual feedback to the user of the first CAD system 10a.

The graphics processor 16 is connected to a memory element 18 in which is stored a representation of a geometric object created by or operated upon by the graphics processor 16. Since this geometric object is created by or operated upon by the first CAD system 10a, it is represented in a first CAD format associated with that CAD system. This representation of the geometric object is communicated, by means of the associative topology bus 20, to the geometry database 21 where it is made available to second, third and fourth CAD systems 10b–d, also linked to the geometry database 21 by the associative topology bus 20. It will be apparent to one of skill in the art that the invention is not dependent on the number of CAD systems linked to the geometry database 21 and that the existence of four CAD systems 10a–10d in the illustrated data processing system 100 is not to be construed as a limitation on the claimed subject matter.

Using the input device 11, the user typically enters instructions to either create a new geometric object or to manipulate or modify an existing geometric object. The geometric object can be a single geometric shape, a homogeneous assembly, or even a heterogeneous assembly. These instructions are transmitted, by way of the main processor 14, to the graphics processor 16.

In the case in which user of the first CAD system 10a creates a new geometric object, the graphics processor 16 executes the instructions provided by the user and creates a representation of the geometric object in the memory element 18 using its own proprietary format, namely the first CAD format. Because this is the format used to create the object, it is designated as the "source format" for that geometric object. It is understood that the designation of a particular format as being the source format depends on the source of the geometric object. For example, if a geometric object is originally created by a user of the second CAD system 10b, then the second CAD format is designated as the source format for that object.

Concurrently, the graphics processor 16 transmits the result of executing the user's instructions to the main processor 14 for translation into a representation suitable for display on the monitor 12. When the user has completed the creation of the geometric object, the graphics processor 16, if instructed to by the user, causes the representation of the geometric object in the memory element 18 to be transmitted, by way of the associative topology bus 20, to the geometry database 21 where it is made available to the other CAD systems 10b–d in communication with the associative topology bus 20. These other CAD systems 10b–d can then include the geometric object created by the first CAD system 10a into heterogeneous assemblies of geometric objects.

Before storing the representation of the object in the geometry database 21, the associative topology bus 20 augments the representation of that object in order to facilitate the sharing of that object with the other CAD systems 10b–d in communication with the associative topology bus 20. The approach used by the associative topology bus 20 in augmenting the geometric object created by the first CAD system 10a is summarized in FIG. 2.

Figure 2:
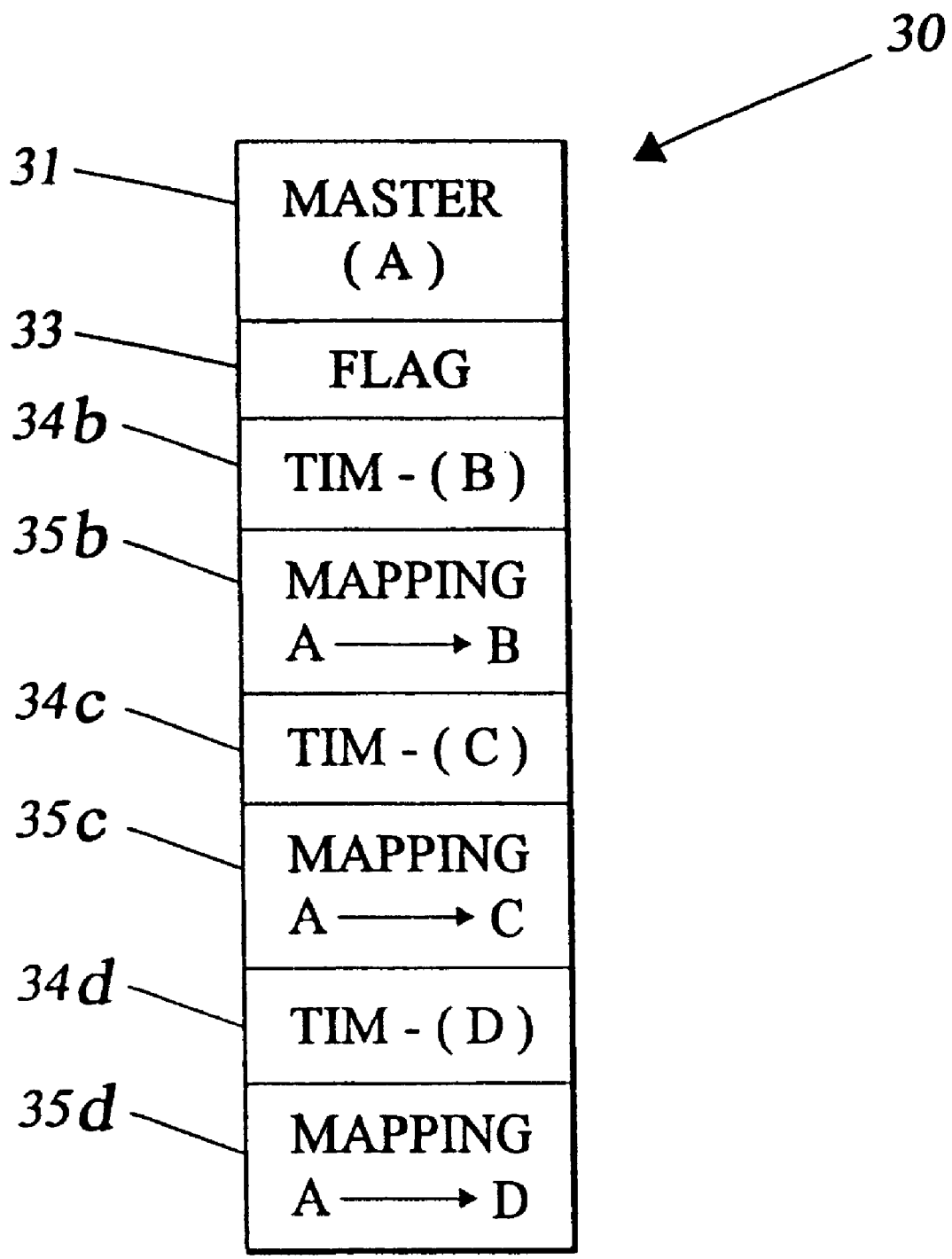
FIG. 2 is an illustration of the manner in which the associative topology bus of FIG. 1 represents a geometric object.

Referring to FIG. 2, the associative topology bus (ATB) representation 30 of the geometric object created by the first CAD system 10a includes a master geometry representation 31 in which the geometric object is encoded in its source format. The master geomerty representation 31 optionally includes an ownership flag identifying the creator of the geometric object, thereby providing the system 10 with a mechanism for preventing any CAD system other than the CAD system that created the geometric object from modifying that object.

The ATB representation 30 of the geometric object created by the first CAD system 10a also includes a change flag 32 indicative of the history of the geometric object represented in the master geometry representation 31. The change flag 32 can include the date and time of last modification or any other indicia of a change in the geometric object represented in the master geomerty representation 31. The associative topology bus 20 monitors the change flag 32 and generates an appropriate signal for transmission to other CAD systems accessing the geometric object created by the first CAD system 10a whenever it detects a change in that object.

The remaining elements of the ATB representation 30 include a plurality of mapping tables 35b–d and a corresponding plurality of translated image models 34b–d. Each mapping table 35b–d is a mapping between the geometric object in the master geometry representation 31, which is in the source format, and an equivalent geometric object represented in a CAD format other than the source format. Each translated image model 34b–d is a translation, into a CAD format other than the source CAD format, of the geometric object in the master geometry representation 31. The translated image models 34b–d are derived from the application of a corresponding mapping table 35b–d to the master geometry representation 31 of the geometric object.

Thus, in this example, in which the geometric object is created by the first CAD system 10a, the first mapping table 35b provides a mapping between the geometric object represented in the first CAD format and an equivalent geometric object represented in the second CAD format, namely the format associated with the second CAD system 10b. The associative topology bus 20 then derives the corresponding translated image model 34b by applying the first mapping table 35b to the master geometry representation 31.

Figure 3:
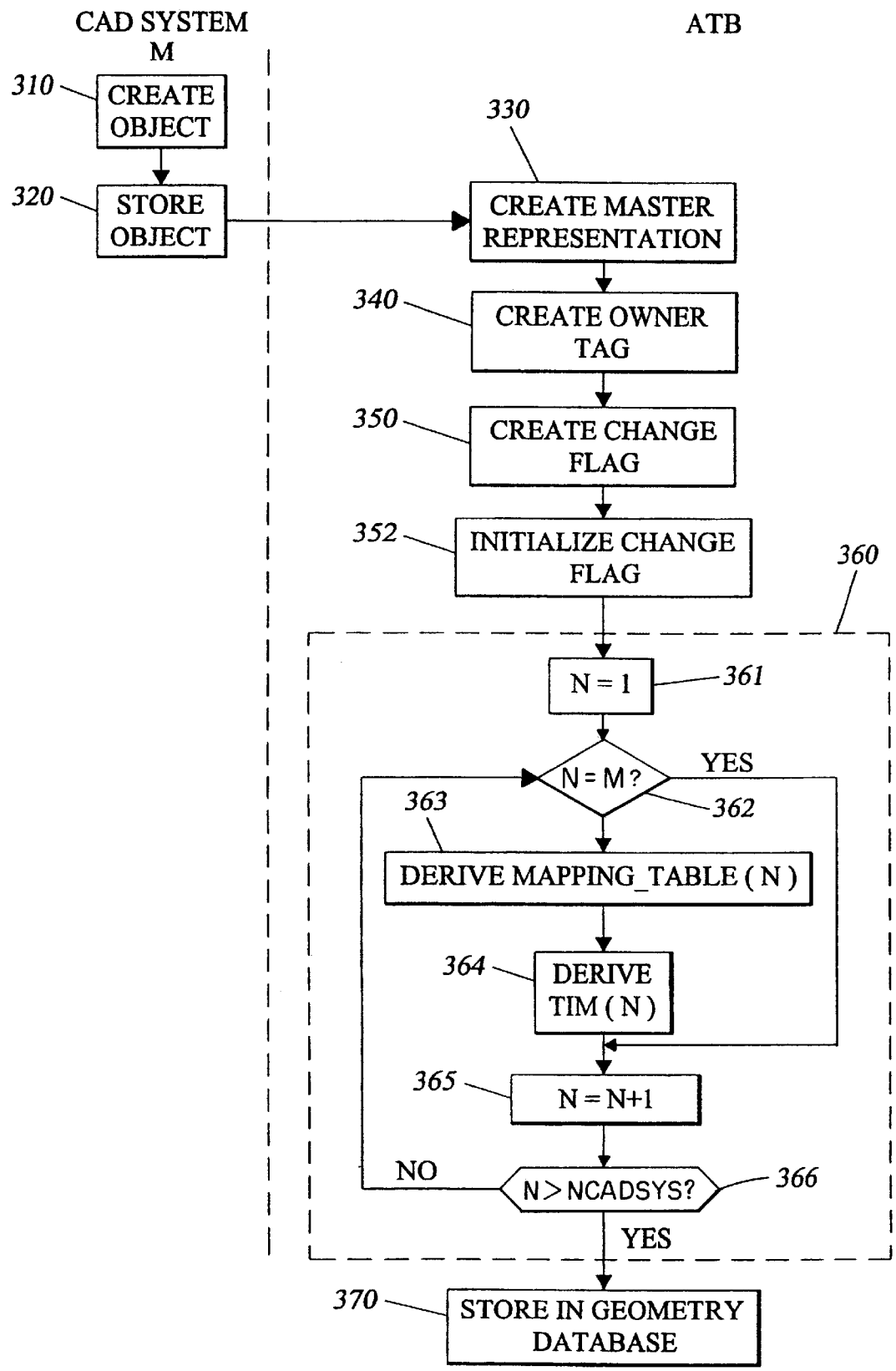
FIG. 3 is a flow-chart illustrating a method by which the associative topology bus and one of the CAD systems of FIG. 1 cooperate to create an augmented representation of a geometric object.

The procedure associated with placing a new geometric object in the geometry database is summarized in the flowchart of FIG. 3. Without loss of generality, the illustrated procedure contemplates the creation of an object by an $M^{th}$ CAD system in an environment having NCADSYS CAD systems.

The procedure begins with the step 310 in which the $M^{th}$ CAD system creates a geometric object and issues an instruction to the associative topology bus to store 320 that object. In response, the associative topology bus creates 330 a master geometry representation of the geometric object in the format associated with the $M^{th}$ CAD system. The associative topology bus then augments the master geometry representation by: creating 340 a tag indicating that the owner of that geometric object is the $M^{th}$ CAD system, creating 350 a change flag, and initializing 352 that change flag to indicate the date and time of the creation of the geometric object.

The next step followed by the associative topology bus is to execute a loop 360 NCADSYS-1 times to generate a translated image model for each of the NCADSYS-1 CAD systems other than the $M^{th}$ CAD system. Within that loop, the associative topology bus initializes 361 a counter and checks 362 to see if the counter corresponds to the owner of the geometric object. If the associative topology bus determines that the counter is set to a CAD system other than that which owns the geometric object (the $M^{th}$ CAD system in this example), the associative topology bus derives 363 a mapping table associated with that CAD system. Based on the mapping table and the master geometry representation, the associative topology bus then derives 364 the translated image model corresponding to that CAD system. The associative topology bus then increments 365 the counter and checks 366 a terminating condition. If the terminating condition is unsatisfied, the associative topology bus executes 360 the loop again for the next CAD system. Otherwise, the associative topology bus exits the loop and stores 370 the augmented representation of the geometric object in the geometry database.

In the case in which an existing geometric object is to be modified, the associative topology bus 20 first determines whether the CAD system requesting access to the existing geometric object is authorized to modify that object. Having done so, the associative topology bus 20 then retrieves the master geometry representation for that object and provides it to the requesting CAD system for modification. After modification, the data processing system 100 follows the procedure set forth above in connection with creation of an object.

Figure 4:
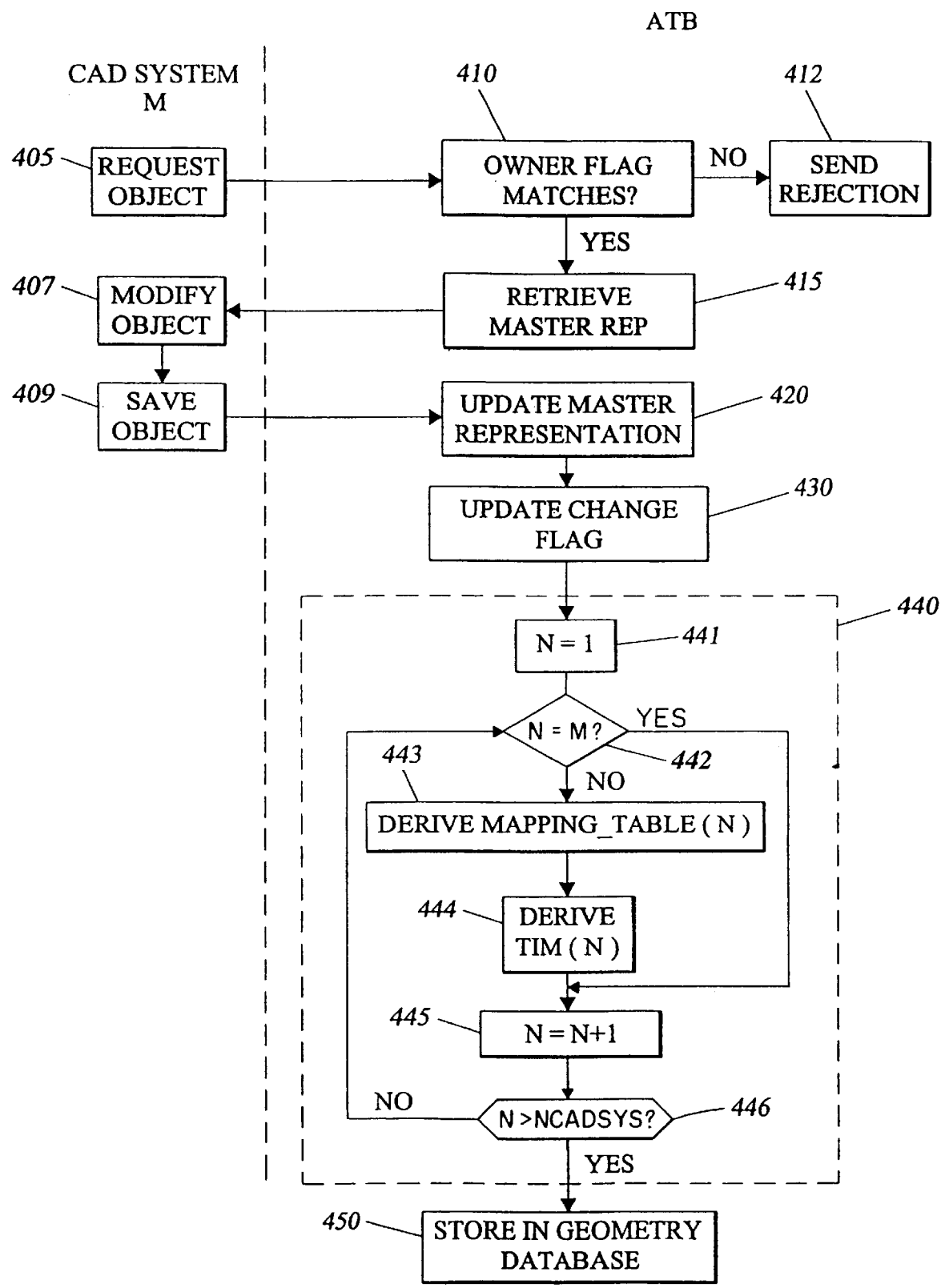
FIG. 4 is a flow-chart illustrating a method by which one of the CAD systems of FIG. 1 cooperates with the associative topology bus to modify the augmented representation of the geometric object.

The procedure associated with modifying an existing geometric object stored in the geometry database is summarized in the flowchart of FIG. 4. Without loss of generality, the illustrated procedure contemplates the updating of a geometric object by an $M^{th}$ CAD system in an environment having NCADSYS CAD systems.

The procedure begins with the step 405 in which the $M^{th}$ CAD system issues an instruction to the associative topology bus requesting 405 a particular geometric object. In response, the associative topology bus verifies 410 that the owner flag associated with the requested object is consistent with the identity of the $M^{th}$ CAD system. If it is not, then the $M^{th}$ CAD system is not authorized to modify the requested object and the associative topology bus rejects 412 the request. If it is, then the associative topology bus retrieves 415 the master geometry representation of the geometric object from the geometry database and provides it to the $M^{th}$ CAD system.

In response to the user's commands, the $M^{th}$ CAD system modifies 407 the object. Once modification is completed, the user generally issues a command to save 409 the object in the geometry database for later use by other CAD systems connected to the associative topology bus. The instruction to save the modified geometric object causes the associative topology bus to execute the steps of updating 420 the master geometry representation of the geometric object to incorporate the modifications and updating 430 the change flag so that any CAD system accessing a heterogeneous assembly that references the modified geometric object can readily recognize the existence of a change.

The next step followed by the associative topology bus following the issuance of the save command by the $M^{th}$ CAD system is to execute a loop 440 NCADSYS-1 times to update the translated image models for all CAD systems other than the $M^{th}$ CAD system. Within the loop, the associative topology bus initializes 441 a counter and checks 442 to see if the counter corresponds to the creator of the geometric object. If the associative topology bus determines that the counter value corresponds to a CAD system other than that which owns the geometric object (the $M^{th}$ CAD system in this example), it updates 443 the mapping table associated with that CAD system. Based on the updated mapping table and the updated master geometry representation, the associative topology bus updates 444 the translated image model corresponding to that CAD system. The associative topology bus then increments 445 the counter and checks 446 to see if a terminating condition is satisfied. If the terminating condition is unsatisfied, the associative topology bus re-executes 440 the loop to update the mapping table and the translated image model for the next CAD system. Otherwise, the associative topology bus exits the loop and stores 450 the resulting augmented representation of the geometric object in the geometry database.

In the case in which an existing geometric object is to be incorporated into a heterogeneous assembly, the graphics processor 16 of the requesting CAD system instructs the associative topology bus 20 to retrieve the existing object from the geometry database 21. The associative topology bus 20 then extracts the appropriate translated image model 34b–d corresponding to the existing object and loads a representation of the geometric object into the memory element 18 in a format suitable for processing by the CAD system 10. In addition, the bus 20 generates a link indicating that the existing geometric object is referenced by that heterogeneous assembly so that in the event that there is a change in that geometric object, the requesting CAD system is notified.

Figure 5:
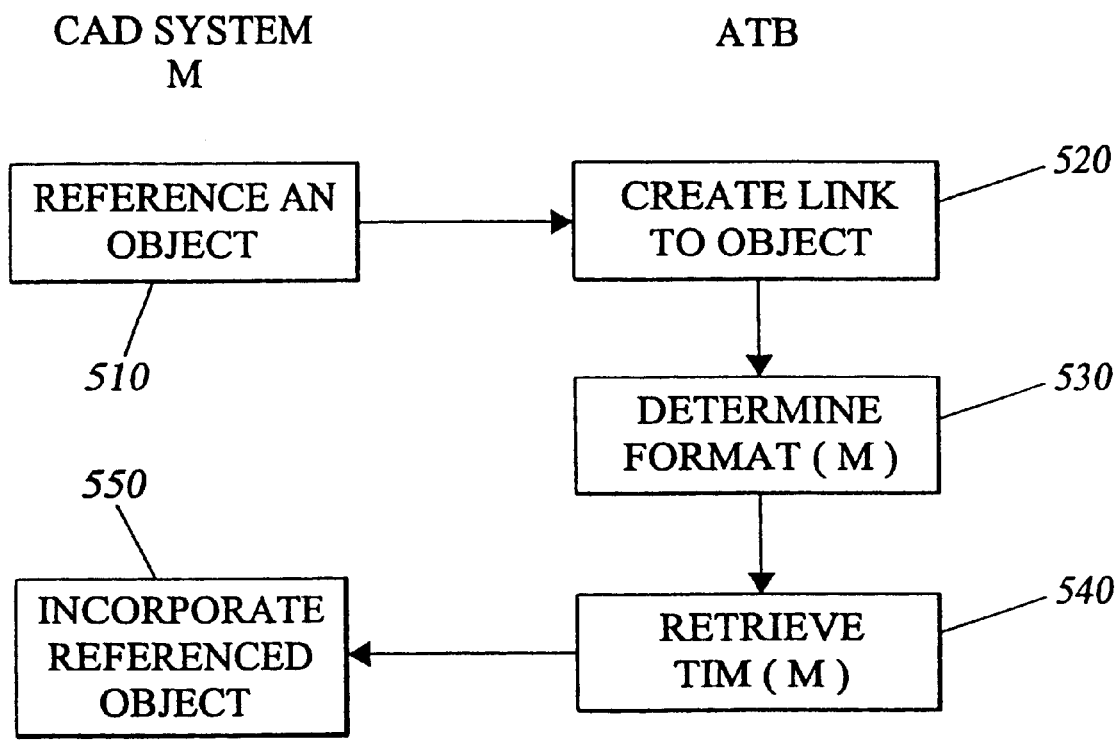
FIG. 5 is a flow-chart illustrating a method by which one of the CAD systems uses the associative topology bus to reference a geometric object for inclusion in a heterogeneous assembly.

The procedure associated with incorporating an existing geometric object into a heterogeneous assembly, summarized in the flowchart of FIG. 5, begins with the step 510 in which an $M^{th}$ CAD system issues an instruction to the associative topology bus requesting 510 that a particular geometric object be referenced. In response, the associative topology bus creates 530 a link to that object indicating that the $M^{th}$ CAD system referencing that object. This allows the associative topology bus to monitor the change flag and to notify the $M^{th}$ system upon detection of a change in the object. Since more than one CAD system can reference the same object in a heterogeneous assembly, it follows that there can be several links associated with a geometric object.

Based on the identity of the $M^{th}$ CAD system, the associative topology bus identifies 510 a format that can be understood by the $M^{th}$ CAD system. The associative topology bus then retrieves 540 the translated image model corresponding to that object and transmits that translated image model to the $M^{th}$ CAD system. Finally, the $M^{th}$ CAD system incorporates 550 the translated image model into the heterogeneous assembly.

It is to be understood that the foregoing method can be applied recursively. For example, it may be that the geometric object created by the first CAD system is itself an assembly, either homogeneous or heterogeneous. Additionally, the geometric object operated upon by the first CAD system could be an assembly which itself contains other assemblies, both homogeneous and heterogeneous.

It is apparent from the foregoing that the associative topology bus 20, by augmenting the representation of a geometric object in the manner set forth above, facilitates the free interchange of that object among a plurality of CAD systems and provides a mechanism for notifying all CAD systems accessing a particular geometric object with up-to-date information on the status of that object and any changes made to that object.

Having described our invention and a preferred embodiment thereof, what we claim as new and secured by Letters Patent is:

1. A method of detecting a change in a constituent component of a heterogeneous assembly operated upon by a target CAD system, the method comprising the steps of:
   providing a master geometry representation of the heterogeneous assembly, the master geometry representation being in a target format associated with the target CAD system;
   providing means indicative of a change in the constituent component of the heterogeneous assembly, the constituent component being represented in a source format foreign to the target CAD system; and
   monitoring the means indicative of a change to detect a change in the constituent component of the heterogeneous assembly.

2. The method of claim 1 further comprising the step of transmitting a message to the target CAD system upon the detection of a change in the constituent component.

3. The method of claim 1 wherein the step of providing a master geometry representation comprises the step of providing an owner flag indicative of ownership of the heterogeneous assembly by the target CAD system.

4. The method of claim 3 further comprising the step of locking the heterogeneous assembly so that only a CAD system having ownership of the heterogeneous assembly can modify the heterogeneous assembly.

5. The method of claim 1 further comprising the steps of
   providing a mapping table for establishing a correspondence between the source format representation of the constituent component and a target format representation of the constituent component; and
   deriving, from the master geometry representation and the mapping table, a translated image model representative of the constituent component in the target format.

6. The method of claim 1 wherein the constituent component of the heterogeneous assembly is a second heterogeneous assembly.

7. The method of claim 1 further comprising the step of providing a geometry database linked to the target CAD system for storing the constituent component.

8. A data processing system for detecting a change in a constituent component of a heterogeneous assembly representative of a geometric structure, the data processing system comprising:
   a first CAD system for operating upon the heterogeneous assembly, the first CAD system having an associated first format;
   a second CAD system for modifying the constituent component of the heterogeneous, assembly, the second CAD system having an associated second format different from the first format, and
   an associative topology bus linking the first CAD system to the second CAD system, the associative topology bus having means for detecting a change in the constituent component by the second CAD system.

9. The data processing system of claim 8 further comprising means for notifying the first CAD system of the change in the constituent component.

10. The data processing system of claim 8 wherein the means for detecting a change in the constituent component comprises:
    a master geometry representation of the heterogeneous assembly, the master geometry representation being in the first format;
    a change flag indicative of the change in the constituent component of the heterogeneous assembly, the constituent component being represented in the second format; and
    means for monitoring the change flag to detect the change in the constituent component.

11. The data processing system of claim 10 wherein the master geometry representation further comprises an owner flag indicative of ownership of the heterogeneous assembly by the first CAD system.

12. The data processing system of claim 10 further comprising:
    a mapping table for establishing a correspondence between a representation of the constituent component in the first format and a representation of the constituent component in the second format; and
    means for deriving, from the master geometry representation and the mapping table, a translated image model representative of the constituent component in the first format.

13. The data processing system of claim 8 wherein the constituent component of the heterogeneous assembly is a second heterogeneous assembly.

14. The data processing system of claim 8 further comprising a geometry database linked to the associative topology bus for storage of the constituent component.

15. A computer-readable medium containing software for detecting a change in a constituent component of a heterogeneous assembly operated upon by a target CAD system, the software comprising instructions for executing the steps of:
    providing a master geometry representation of the heterogeneous assembly, the master geometry representation being in a target format associated with the target CAD system;
    providing means indicative of a change in the constituent component of the heterogeneous assembly, the constituent component being represented in a source format foreign to the target CAD system; and
    monitoring the means indicative of a change to detect a change in the constituent component of the heterogeneous assembly.

16. The computer-readable medium of claim 15 further comprising software instructions for transmitting a message to the target CAD system upon the detection of a change in the constituent component.

17. The computer-readable medium of claim 15 wherein the software instructions for providing a master geometry representation comprise instructions for setting an owner flag indicative of ownership of the heterogeneous assembly by the target CAD system.

18. The computer-readable medium of claim 17 further comprising software instructions for locking the heterogeneous assembly so that only a CAD system having ownership of the heterogeneous assembly can modify the heterogeneous assembly.

19. The computer-readable medium of claim 15 further comprising software instructions for
    providing a mapping table for establishing a correspondence between the source format representation of the constituent component and a target format representation of the constituent component; and
    deriving, from the master geometry representation and the mapping table, a translated image model representative of the constituent component in the target format.

20. The computer-readable medium of claim 15 further comprising instructions for enabling the constituent component of the heterogeneous assembly to be a second heterogeneous assembly.

21. The computer-readable medium of claim 15 further comprising instructions for providing a geometry database linked to the target CAD system for storing the constituent component.

22. A target format representation of a heterogeneous assembly having a constituent geometric object represented in a source format, said representation comprising a master geometry representation of the heterogeneous assembly, the master geometry representation being in the target format;

a change flag indicative of a change in the constituent geometric object;

a mapping table for establishing a correspondence between a source format representation of the constituent geometric object and a target format representation of the constituent geometric object; and a translated image model derived from the mapping table, the translated image model including a translation of the source format representation of the constituent geometric object into a target format representation of the constituent geometric object.

23. A method of detecting a change in a constituent component of a heterogeneous assembly operated upon by a target CAD system, the method comprising the steps of:

providing a master geometry representation of the heterogeneous assembly, the master geometry representation being in a target format associated with the target CAD system;

providing a change flag indicative of a change in the constituent component of the heterogeneous assembly, the constituent component being represented in a source format foreign to the target CAD system;

monitoring the change flag to detect a change in the constituent component of the heterogeneous assembly; and providing a geometry database linked to the target CAD system for storing the constituent component.

24. A data processing system for detecting a change in a constituent component of a heterogeneous assembly representative of a geometric structure, the data processing system comprising:

a first CAD system for operating upon the heterogeneous assembly, the first CAD system having an associated first format;

a second CAD system for modifying the constituent component of the heterogeneous assembly, the second CAD system having an associated second format different from the first format;

an associative topology bus linking the first CAD system to the second CAD system, the associative topology bus having means for detecting a change in the constituent component by the second CAD system; and a geometry database linked to the first and second CAD system by the associative topology bus for storage of the constituent component.

* * * * *